(12) United States Patent
Choi et al.

(10) Patent No.: US 12,526,961 B2
(45) Date of Patent: Jan. 13, 2026

(54) SYSTEMS FOR COOLING MODULE ASSEMBLY FOR INVERTER FOR ELECTRIC VEHICLE

(71) Applicant: BorgWarner US Technologies LLC, Wilmington, DE (US)

(72) Inventors: Edward Choi, Lake Orion, MI (US); Andreas Mayer, Auburn Hills, MI (US)

(73) Assignee: BorgWarner US Technologies LLC, Wilmington, DE (US)

( * ) Notice: Subject to any disclaimer, the term of this patent is extended or adjusted under 35 U.S.C. 154(b) by 185 days.

(21) Appl. No.: 18/330,480

(22) Filed: Jun. 7, 2023

(65) Prior Publication Data

US 2024/0414885 A1  Dec. 12, 2024

(51) Int. Cl.
*H05K 7/20* (2006.01)
*H05K 7/14* (2006.01)

(52) U.S. Cl.
CPC ....... *H05K 7/20418* (2013.01); *H05K 7/1432* (2013.01); *H05K 7/20854* (2013.01); *H05K 7/209* (2013.01)

(58) Field of Classification Search
CPC ............. H05K 7/20418; H05K 7/1432; H05K 7/20854; H05K 7/209
USPC ......................................................... 361/710
See application file for complete search history.

(56) References Cited

U.S. PATENT DOCUMENTS

| | | | |
|---|---|---|---|
| 6,812,553 B2 | 11/2004 | Gerbsch et al. |
| 6,943,293 B1 | 9/2005 | Jeter et al. |
| 7,095,098 B2 | 8/2006 | Gerbsch et al. |
| 7,229,855 B2 | 6/2007 | Murphy |
| 7,295,433 B2 | 11/2007 | Taylor et al. |
| 7,538,425 B2 | 5/2009 | Myers et al. |
| 7,551,439 B2 | 6/2009 | Peugh et al. |
| 10,342,119 B1 | 7/2019 | Mujcinovic |

(Continued)

FOREIGN PATENT DOCUMENTS

| | | |
|---|---|---|
| CN | 109041504 A | 12/2018 |
| CN | 113746351 A | 12/2021 |

(Continued)

OTHER PUBLICATIONS

"The X factor: X-Rings vs O-Rings", Dec. 3, 2020, Techno Ad, Entire Document (https://www.technoad.com/x-rings-vs-o-rings/). (Year: 2020).

(Continued)

*Primary Examiner* — Mandeep S Buttar
*Assistant Examiner* — Kyle Oxenknecht
(74) *Attorney, Agent, or Firm* — Joshua M. Haines; Bookoff McAndrews, PLLC

(57) ABSTRACT

A system for an electric vehicle includes: a first heat sink including a first mounting hole extending through the first heat sink; a second heat sink positioned adjacent to the first heat sink in an axial direction; and a spacer between the first heat sink and the second heat sink to set a distance between the first heat sink and the second heat sink, the spacer including: a flange that is coupled to both the first heat sink and the second heat sink, the flange having a thickness in the axial direction, and a protrusion extending away from the flange, the protrusion received by the first mounting hole of the first heat sink.

20 Claims, 9 Drawing Sheets

(56) References Cited

U.S. PATENT DOCUMENTS

| | | |
|---|---|---|
| 2006/0219396 A1 | 10/2006 | Abei et al. |
| 2011/0188204 A1* | 8/2011 | Horiuchi ............ H05K 7/20927 |
| | | 29/527.1 |
| 2013/0003301 A1 | 1/2013 | Miyamoto et al. |
| 2013/0107457 A1 | 5/2013 | Campbell et al. |
| 2016/0211192 A1 | 7/2016 | Mizuno et al. |
| 2019/0335608 A1* | 10/2019 | Song .................. H05K 7/20854 |
| 2019/0341327 A1 | 11/2019 | Teysseyre et al. |
| 2020/0344920 A1 | 10/2020 | Lee et al. |
| 2021/0125768 A1 | 4/2021 | Chen et al. |
| 2021/0144879 A1 | 5/2021 | Kang et al. |
| 2021/0178859 A1 | 6/2021 | Bellino et al. |
| 2021/0280498 A1 | 9/2021 | Kang et al. |
| 2022/0042569 A1 | 2/2022 | Ott et al. |
| 2022/0095493 A1 | 3/2022 | Blanchard St-Jacques et al. |
| 2022/0132705 A1 | 4/2022 | Langenfeld |
| 2022/0200356 A1* | 6/2022 | Luzinski ................. H02J 50/10 |
| 2022/0384106 A1 | 12/2022 | Park et al. |
| 2024/0030096 A1* | 1/2024 | Zhu .......................... H05K 1/18 |
| 2024/0317022 A1 | 9/2024 | Wiland et al. |

FOREIGN PATENT DOCUMENTS

| | | | | |
|---|---|---|---|---|
| CN | 114867273 A | * | 8/2022 | .............. H02M 1/00 |
| DE | 102017214490 A1 | * | 2/2019 | .............. H01L 21/52 |
| TW | M598589 U | * | 7/2020 | ............... H05K 7/20 |

OTHER PUBLICATIONS

"X Ring vs. 0 Ring: How To Choose the Correct One", Mar. 21, 2019, AbbeySeals, Entire Document (https://www.abbeyseals.ie/x-ring-vs-o-ring-how-to-choose-the-correct-one/). (Year: 2019).

* cited by examiner

SYSTEMS FOR COOLING MODULE ASSEMBLY FOR INVERTER FOR ELECTRIC VEHICLE

FIELD

Various embodiments of the present disclosure relate generally to systems for a cooling module and assembly, and more particularly, to systems for providing thermal performance and power density.

INTRODUCTION

A power module is considered a key component in a traction inverter to control the performance and efficiency of a driving system in an electric vehicle. Thermal management for a power module is therefore a critical aspect for performance and reliability of an electric vehicle. However, some thermal management methods for a double-sided cooled power module have limited capability for thermal performance optimization and low-cost manufacturability due to design and material selection.

The present disclosure is directed to overcoming one or more of these above referenced challenges.

SUMMARY OF THE DISCLOSURE

In some aspects, the techniques described herein relate to a system for an electric vehicle, the system including: a first heat sink including a first mounting hole extending through the first heat sink; a second heat sink positioned adjacent to the first heat sink in an axial direction; and a spacer between the first heat sink and the second heat sink to set a distance between the first heat sink and the second heat sink, the spacer including: a flange that is coupled to both the first heat sink and the second heat sink, the flange having a thickness in the axial direction, and a protrusion extending away from the flange, the protrusion received by the first mounting hole of the first heat sink.

In some aspects, the techniques described herein relate to a system, wherein the second heat sink includes an integrated spacer to cooperate with the spacer to control the distance between the first heat sink and the second heat sink.

In some aspects, the techniques described herein relate to a system, wherein the second heat sink includes fins.

In some aspects, the techniques described herein relate to a system, further including: a housing of an inverter, the housing including a cavity to receive the fins.

In some aspects, the techniques described herein relate to a system, further including: a fastener, wherein the second heat sink includes a second mounting hole, and wherein the fastener passes through the first mounting hole, the spacer, and the second mounting hole to fasten the first heat sink to the second heat sink.

In some aspects, the techniques described herein relate to a system, further including: a spring washer for the fastener.

In some aspects, the techniques described herein relate to a system, further including: a power module configured to convert direct current (DC) from a battery to alternating current (AC) current, wherein the power module is positioned between the first heat sink and the second heat sink.

In some aspects, the techniques described herein relate to a system, wherein the spacer provides galvanic compliance between the first heat sink and the second heat sink.

In some aspects, the techniques described herein relate to an inverter including the system.

In some aspects, the techniques described herein relate to a vehicle including the inverter.

In some aspects, the techniques described herein relate to a cooling module assembly system for an inverter, the cooling module assembly system including: a first heat sink; and a second heat sink including an integrated spacer to set a distance between the first heat sink and the second heat sink.

In some aspects, the techniques described herein relate to a cooling module assembly system, further including: a spacer to cooperate with the integrated spacer to control the distance between the first heat sink and the second heat sink, wherein, along an axial direction of the spacer, the spacer includes a wider portion and a narrower portion.

In some aspects, the techniques described herein relate to a cooling module assembly system, further including: a fastener, wherein the first heat sink includes a first mounting hole, wherein the second heat sink includes a second mounting hole, and wherein the fastener passes through the first mounting hole, the spacer, and the second mounting hole to fasten the first heat sink to the second heat sink.

In some aspects, the techniques described herein relate to a cooling module assembly system, wherein the second heat sink includes fins.

In some aspects, the techniques described herein relate to a cooling module assembly system, further including: a housing of the inverter, the housing including a cavity to receive the fins.

In some aspects, the techniques described herein relate to a cooling module assembly system, wherein a thickness of the integrated spacer is equal to a thickness of a power module of the inverter and a thickness of thermal interface material to connect the power module to the cooling module assembly system between the first heat sink and the second heat sink.

In some aspects, the techniques described herein relate to a cooling module assembly system, wherein the integrated spacer includes a gap to accommodate a power module of the inverter.

In some aspects, the techniques described herein relate to a system including: an inverter configured to convert DC power from a battery to AC power to drive a motor, wherein the inverter includes: a power module; and a cooling system configured to cool the power module, wherein the cooling system includes: a first heat sink including a first mounting hole extending through the first heat sink; a second heat sink including an integrated spacer, the second heat sink positioned adjacent to the first heat sink in an axial direction; and a spacer between the first heat sink and the second heat sink, the spacer including: a flange that is coupled to both the first heat sink and the second heat sink, the flange having a thickness in the axial direction, and a protrusion extending away from the flange, the protrusion received by the first mounting hole of the first heat sink, wherein a distance between the first heat sink and the second heat sink is set by a thickness of the integrated spacer and a thickness of the spacer.

In some aspects, the techniques described herein relate to a system, wherein the thickness of the spacer is equal to a thickness of the power module and a thickness of thermal interface material to connect the power module to the cooling system between the first heat sink and the second heat sink.

In some aspects, the techniques described herein relate to a system, wherein second heat sink includes fins, and wherein the inverter includes a housing including a cavity to receive the fins.

In some aspects, the techniques described herein relate to a system for an electric vehicle, the system including: a first heat sink including a cooling pipe extending in an axial direction; a housing including a port to receive the cooling pipe, the port including an alignment feature; and a second heat sink between the first heat sink and the housing, the second heat sink including an opening to cooperate with the alignment feature of the port to align the second heat sink with the housing.

In some aspects, the techniques described herein relate to a system, wherein the alignment feature includes an alignment dowel.

In some aspects, the techniques described herein relate to a system, wherein the cooling pipe includes a groove and an O-ring seal in the groove, the O-ring seal configured to cooperate with an inner wall of the port to seal the cooling pipe to the port.

In some aspects, the techniques described herein relate to a system, further including: a fastener, wherein the first heat sink includes a first mounting hole, wherein the second heat sink includes a second mounting hole, wherein the housing includes a third mounting hole, and wherein the fastener passes through the first mounting hole and the second mounting hole into the third mounting hole to fasten the first heat sink and the second heat sink to the housing.

In some aspects, the techniques described herein relate to a system, further including: a spring washer for the fastener.

In some aspects, the techniques described herein relate to a system, further including: a spacer between the first heat sink and the second heat sink to set a distance between the first heat sink and the second heat sink, the spacer including: a flange that is coupled to both the first heat sink and the second heat sink, the flange having a thickness in the axial direction, and a protrusion extending away from the flange, the protrusion received by the first mounting hole of the first heat sink.

In some aspects, the techniques described herein relate to a system, wherein the spacer provides galvanic compliance between the first heat sink and the second heat sink.

In some aspects, the techniques described herein relate to a system, wherein the second heat sink includes an integrated spacer to set a distance between the first heat sink and the second heat sink.

In some aspects, the techniques described herein relate to a system, wherein the second heat sink includes fins, and wherein the housing includes a cavity to receive the fins.

In some aspects, the techniques described herein relate to a system, further including: a power module configured to convert direct current (DC) from a battery to alternating current (AC) current, wherein the power module is positioned between the first heat sink and the second heat sink.

In some aspects, the techniques described herein relate to a system for an inverter, the system including: a first heat sink; a housing including a cavity; and a second heat sink between the first heat sink and the housing, the second heat sink extending in an axial direction into the cavity of the housing.

In some aspects, the techniques described herein relate to a system, wherein the second heat sink includes fins extending into the cavity of the housing.

In some aspects, the techniques described herein relate to a system, wherein the cavity of the housing is in fluid communication with one or more of the first heat sink and the second heat sink to transfer coolant.

In some aspects, the techniques described herein relate to a system, wherein the housing includes a housing first port located at one longitudinal end of the housing and a housing second port located at an opposite longitudinal end of the housing, wherein the housing first port and the housing second port complete a fluid interconnection with the first heat sink.

In some aspects, the techniques described herein relate to a system, wherein the housing includes an x-ring seal that seals a connection between the housing and the second heat sink.

In some aspects, the techniques described herein relate to a system, further including: a spacer between the first heat sink and the second heat sink to set a distance between the first heat sink and the second heat sink, the spacer including: a flange that is coupled to both the first heat sink and the second heat sink, the flange having a thickness in the axial direction, and a protrusion extending away from the flange, the protrusion received by the first mounting hole of the first heat sink.

In some aspects, the techniques described herein relate to a system, wherein the second heat sink includes an integrated spacer to set a distance between the first heat sink and the second heat sink.

In some aspects, the techniques described herein relate to a system including: a first heat sink configured to route coolant in a first direction, wherein the first direction extends along a length of the first heat sink; a housing configured to route the coolant in a second direction opposite to the first direction; and a second heat sink between the first heat sink and the housing, the second heat sink arranged parallel to the first heat sink.

In some aspects, the techniques described herein relate to a system, wherein the housing includes a cavity configured to contain the coolant in the housing, and wherein the second heat sink includes fins extending into the cavity of the housing.

In some aspects, the techniques described herein relate to a vehicle including the system.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
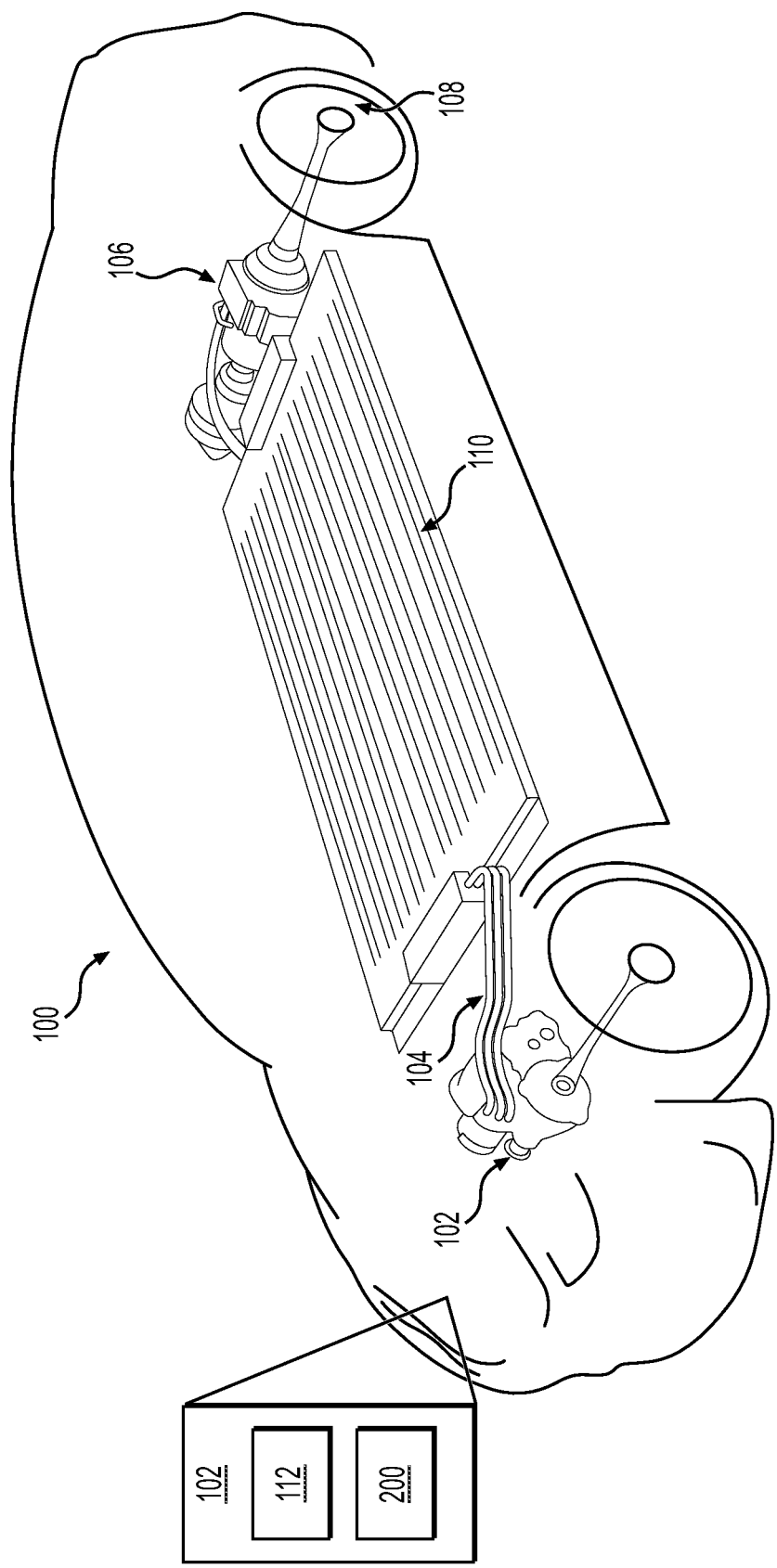
FIG. 1 depicts an exemplary system infrastructure for a vehicle including a traction inverter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the power module may be described as a device, but may refer to any device for controlling the flow of power in an electrical circuit. For example, a power module may be a metal-oxide-semiconductor field-effect transistor (MOSFETs), bipolar junction transistor (BJTs), insulated-gate bipolar transistor (IGBTs), or relays, for example, or any combination thereof, but are not limited thereto.

A power module is considered a key component in a traction inverter to control the performance and efficiency of a driving system in an electric vehicle. Improved thermal management for a power module is therefore a critical aspect for performance and reliability of an electric vehicle. However, some thermal management methods for a double-sided cooled power module have limited capability for thermal performance optimization and low-cost manufacturability due to the design and material selection. Some thermal management methods for power modules cause galvanic corrosion. Some copper heat sinks and/or assemblies require full plating of the surface area that interconnects with the aluminum housing. One or more embodiments may include a spacer that provides galvanic separation between un-plated copper and aluminum.

One or more embodiments may include an inverter housing which may carry flow and coolant distribution features combined with heat sinks. One or more embodiments may reduce the complexity of manufacturing assembly used by some double-sided cooled power modules. One or more embodiments may provide low-cost manufacturing methods or assembly for an inverter. One or more embodiments may include tight tolerance control which may achieve non-galvanic interconnection among dismal material. One or more embodiments may include integrated spacers with a counter flow arrangement which may improve the thermal management of a power module by transferring heat between a top and bottom heatsink. One or more embodiments may include integrated spacers which may provide improved control of assembly tolerance for a bottom heat sink, power module, and top heat sink.

FIG. 1 depicts an exemplary system infrastructure for a vehicle including a traction inverter, according to one or more embodiments. Electric vehicle 100 may include traction inverter 102, connectors 104, drive motor 106, wheels 108, and battery 110. Traction inverter 102 may include power module 112 and cooling module assembly 200. Connectors 104 may connect the traction inverter 102 and battery 110. Traction inverter 102 may include components to receive electrical power from an external source and output electrical power to charge battery 110 of electric vehicle 100. Traction inverter 102, through the use of power module 112, may convert DC power from battery 110 in electric vehicle 100 to AC power, to power the drive motor 106 and wheels 108 of electric vehicle 100, for example, but the embodiments are not limited thereto. The traction inverter 102 may be bidirectional, and may convert DC power to AC power, or convert AC power to DC power, such as during regenerative braking, for example. Traction inverter 102 may be a single-phase inverter, or a multi-phase inverter, such as a three-phase inverter, for example.

Figure 2:
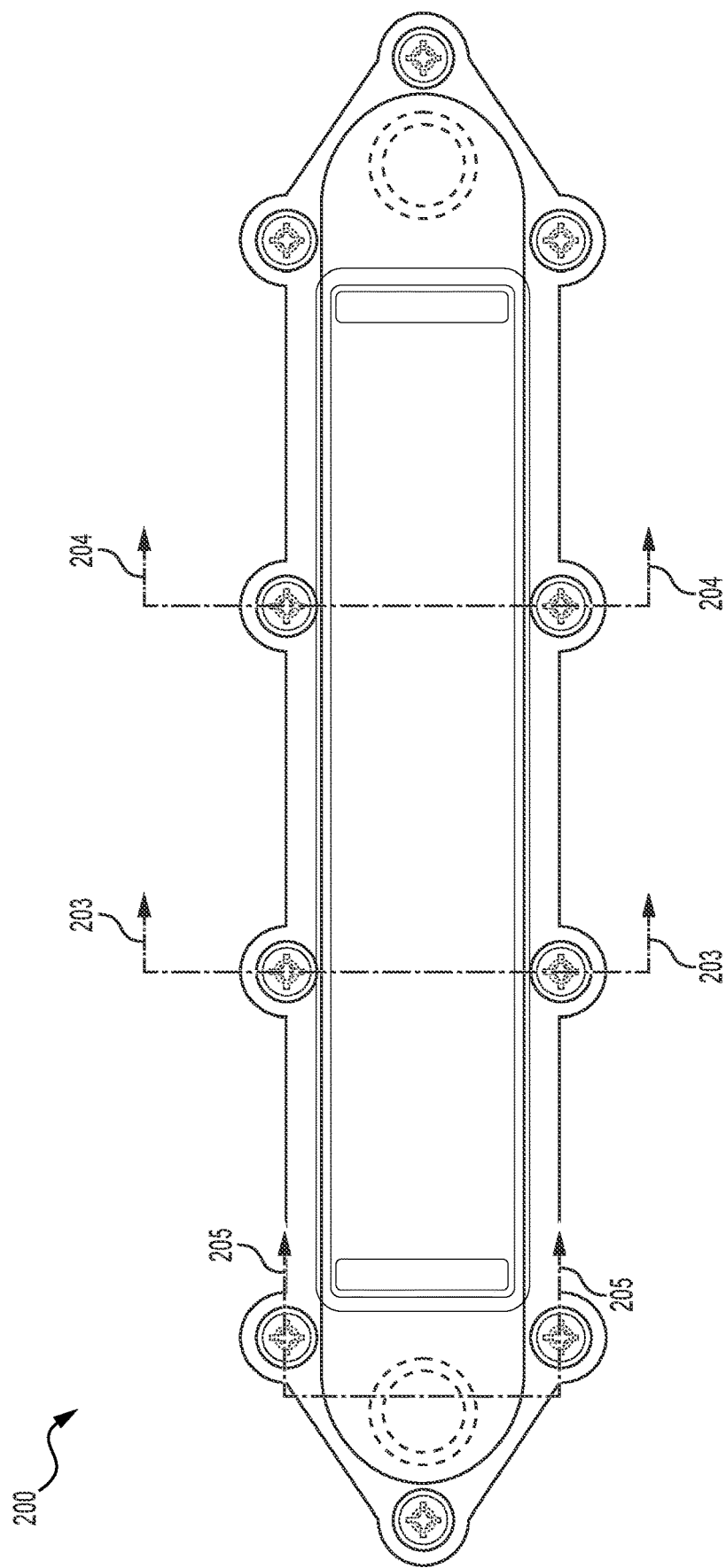
FIG. 2 depicts a top view of an exemplary cooling module assembly, according to one or more embodiments.

FIG. 2 depicts a top view of an exemplary cooling module assembly 200, according to one or more embodiments. FIG. 2 includes line 205, line 203, and line 204, which are reference lines for corresponding cross-sectional views as described below in FIGS. 5, 6, and 7. More specifically, line 205 (see FIG. 7) corresponds to a cross section through a port of cooling module assembly 200, line 203 (see FIG. 5) corresponds to a cross section through a power module in cooling module assembly 200, and line 204 (see FIG. 6) corresponds to a cross section through an integrated spacer of cooling module assembly 200.

Figure 3:
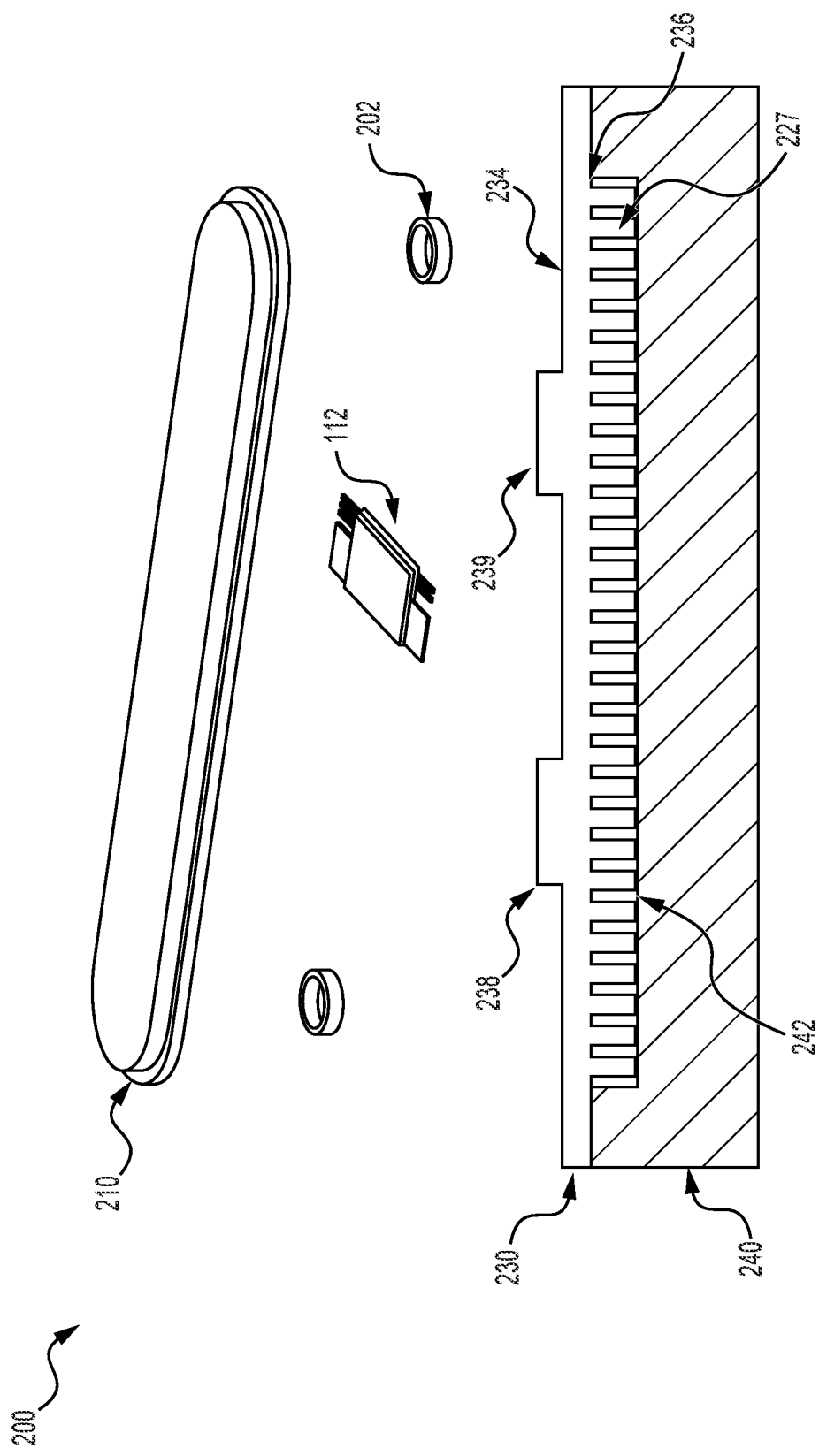
FIG. 3 depicts a side view of the exemplary cooling module assembly of FIG. 2, according to one or more embodiments.

FIG. 3 depicts a side view of the exemplary cooling module assembly 200 of FIG. 2, according to one or more embodiments. Cooling module assembly 200 may dissipate heat from power module 112. As shown in FIG. 3, cooling module assembly 200 may include fluid seal 202, first heat sink 210, and second heat sink 230. Cooling module assembly 200 may be separate from, or may be integrated with or assembled to inverter housing 240.

Fluid seal 202 may include one or more fluid seals. Fluid seal 202 may provide an interconnecting fluid seal between respective ports (see FIG. 4) of first heat sink 210 and second heat sink 230.

Second heat sink 230 may include a first surface 234 to face first heat sink 210. First surface 234 of second heat sink 230 may include a first integrated spacer 238. First surface 234 of second heat sink 230 may include a second integrated spacer 239. First integrated spacer 238 on first surface 234 may be located away from second integrated spacer 239 on first surface 234 to form a gap to accommodate power module 112. Although FIG. 3 depicts first surface 234 of second heat sink 230 with two integrated spacers (e.g. first integrated spacer 238 and second integrated spacer 239), first surface 234 of second heat sink 230 may include one integrated spacer or more than two integrated spacers. For example, first surface 234 of second heat sink 230 may include five integrated spacers.

Second heat sink 230 may include second surface 236 to face inverter housing 240. Second surface 236 of second heat sink 230 may include fins 227. Fins 227 may be provided in an extruded, folded, bonded, active fan, stamping, or cross-cut configuration. First heat sink 210 may be in contact with second heat sink 230. First heat sink 210 may be in contact with first surface 234 of second heat sink 230. First integrated spacer 238 of second heat sink 230 may be in contact with first heat sink 210. Second integrated spacer 239 of second heat sink 230 may be in contact with first heat sink 210.

The material of first heat sink 210 and second heat sink 230 may be selected based on the thermal performance required to draw heat away from power module 112. For example, first heat sink 210 and second heat sink 230 may include an aluminum alloy. First heat sink 210 and second heat sink 230 may include copper.

Power module 112 may be located between first heat sink 210 and second heat sink 230. Power module 112 may be in contact with first heat sink 210 and first surface 234 of second heat sink 230. Power module 112 may include one or more silicon carbide (SiC)-based power devices that deliver relatively high power densities and efficiencies needed to extend battery range and performance. Power module 112 may include circuitry and components configured to convert direct current (DC) from the battery 110 to alternating current (AC) current, which may be utilized within drive motor 106 that may drive wheels 108. Power module 112 may be installed on one or more power board assemblies. Power module 112 may include a combination of transistors, diodes, metal oxide semiconductor field effect transistors (MOSFETs), insulated-gate bipolar transistors (IGBTs), and silicon-controlled rectifiers (SCRs).Power module 112 may include a combination of transistors, which may allow for the switch-ability of the direction of the current through drive motor 106 from battery 110. Additionally, Power module 112 may include devices for inverting applications such as switching direct current electricity into alternating current.

Inverter housing 240 may include cavity 242. Second surface 236 of second heat sink 230 may be in contact with inverter housing 240. Fins 237 of second heat sink 230 may be inserted in cavity 242 of inverter housing 240.

Figure 4:
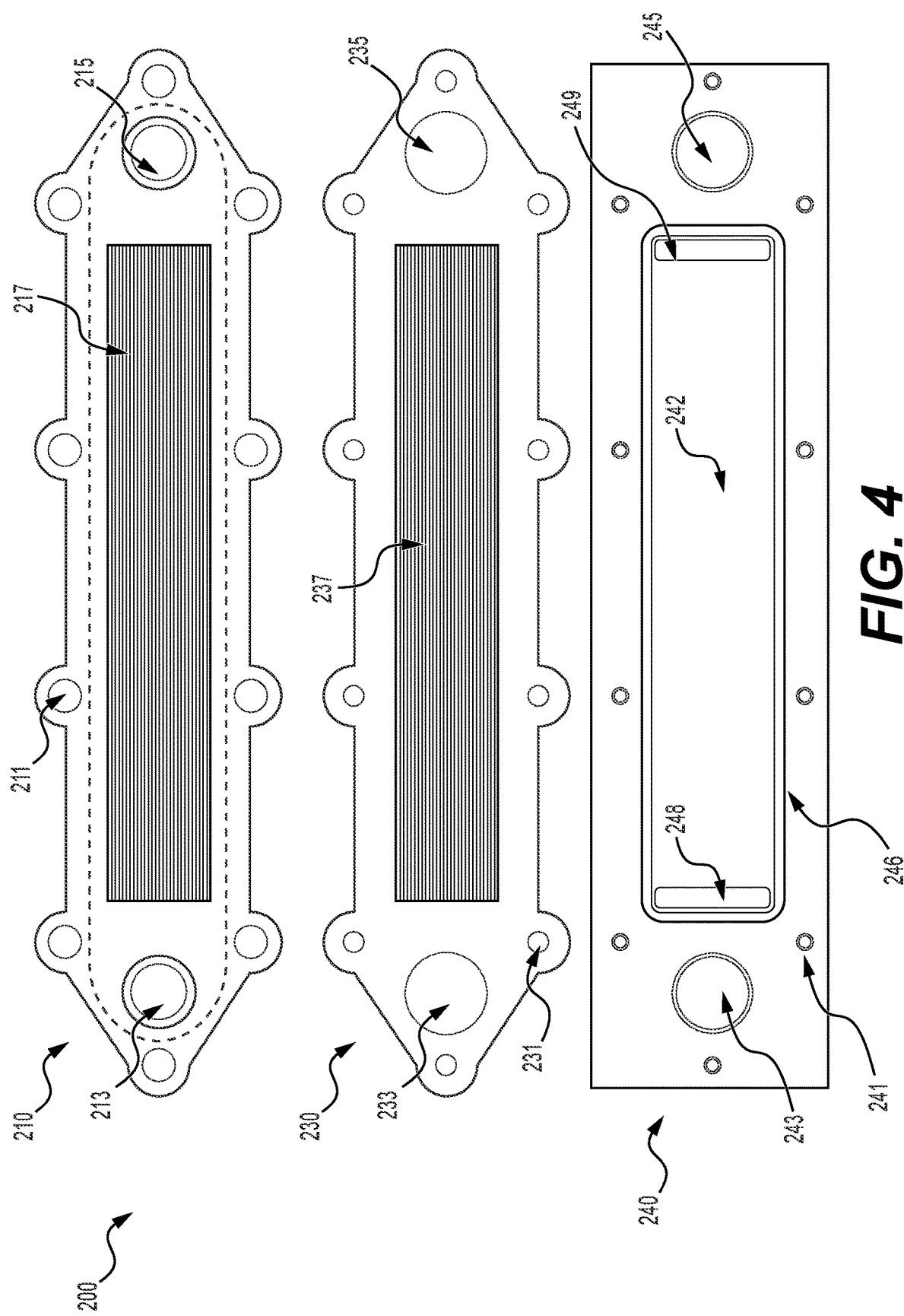
FIG. 4 depicts an exploded view of the exemplary cooling module assembly of FIG. 2, according to one or more embodiments.

FIG. 4 depicts an exploded view of exemplary cooling module assembly 200 of FIG. 2, according to one or more embodiments. Cooling module assembly 200 may include a first heat sink 210, second heat sink 230, and inverter housing 240.

First heat sink 210 may include first mounting hole 211. First mounting hole 211 may be one or more mounting holes. First mounting hole 211 may be circular or any polygon shape. First mounting hole 211 may be located at an outer perimeter of first heat sink 210. First heat sink 210 may include first heat sink first port 213, which may supply liquid coolant to first heat sink 210 or exhaust liquid coolant from first heat sink 210. First heat sink first port 213 may be a circular opening, for example. First heat sink 210 may include first heat sink second port 215, which may supply liquid coolant to first heat sink 210 or exhaust liquid coolant from first heat sink 210. First heat sink second port 215 may be circular. First heat sink first port 213 and first heat sink second port 215 may include integrated rod/piston seals, or any sealing method, such as adhesives or gaskets, for example. First heat sink first port 213 may be located at one longitudinal end of first heat sink 210 and first heat sink second port 215 may be located at the opposite longitudinal end of first heat sink 210. First heat sink 210 may include fins 217 which may be provided in an extruded, plain, wavy, pin, folded, bonded, active fan, stamping, or cross-cut configuration. Fins 217 may be located between first heat sink first port 213 and first heat sink second port 215. First heat sink 210 may be extruded, forged, cast, and/or machined out of aluminum or copper alloys, for example.

Second heat sink 230 may be located between first heat sink 210 and inverter housing 240. Second heat sink 230 may include second mounting hole 231. Second mounting hole 231 may be one or more mounting holes. Second mounting hole 231 may be circular or any polygon shape. Second mounting hole 231 may be located at an outer perimeter of second heat sink 230. Second heat sink 230 may include second heat sink first port 233, which may supply liquid coolant to second heat sink 230 or exhaust liquid coolant from second heat sink 230. Second heat sink first port 233 may be circular.

Second heat sink 230 may include second heat sink second port 235, which may supply liquid coolant to second heat sink 230 or exhaust liquid coolant from second heat sink 230. Second heat sink second port 235 may be circular. Second heat sink first port 233 may be located at one longitudinal end of second heat sink 230, and Second heat sink second port 235 may be located at the opposite longitudinal end of second heat sink 230. Second heat sink 230 may include fins 237, which may be provided in an extruded, plain, wavy, pin, folded, bonded, active fan, stamping, or cross-cut configuration. Fins 237 may be located between second heat sink first port 233 and second heat sink second port 235 of second heat sink 230. Second heat sink 230 may be in contact with first heat sink 210. Second heat sink 230 may be extruded, forged, cast, and/or machined out of aluminum or copper alloys, for example.

Inverter housing 240 may include third mounting hole 241. Third mounting hole 241 may include one or more mounting holes. Third mounting hole 241 may be circular or any polygon shape. Third mounting hole 241 may be located at an outer perimeter of inverter housing 240. Inverter housing 240 may include inverter housing first port 243, which may supply liquid coolant to inverter housing 240 or exhaust liquid coolant from inverter housing 240. Inverter housing first port 243 may be round. Inverter housing 240 may include inverter housing second port 245, which may supply liquid coolant to inverter housing 240 or exhaust liquid coolant from inverter housing 240. Inverter housing second port 245 may be round. Inverter housing first port 243 may be located at one longitudinal end of inverter housing 240 and inverter housing second port 245 may be located at the opposite longitudinal end of inverter housing 240. Inverter housing first port 243 and inverter housing second port 245 of inverter housing 240 may complete fluid interconnections with first heat sink 210.

Inverter housing first port 243 may include an integrated alignment feature, such as alignment dowel 295 (see FIG. 7), for example. Inverter housing second port 245 may include an integrated alignment feature. Inverter housing 240 may include x-ring seal 246, which may seal a connection between inverter housing 240 and second heat sink 230. Inverter housing 240 may include a cavity 242. Cavity 242 may include first cavity port 248. First cavity port 248 may be rectangular. First cavity port 248 may supply liquid coolant to cavity 242 or exhaust liquid coolant from cavity 242. Cavity 242 may include second cavity port 249. Second cavity port 249 may be rectangular. Second cavity port 249 may supply liquid coolant to cavity 242 or exhaust liquid coolant from cavity 242. First cavity port 248 and second cavity port 249 may be sealed with a face seal or any sealing method, such as adhesives or gaskets, for example. Inverter housing 240 may be in contact with second heat sink 230. Second heat sink 230 may be in contact with cavity 242 of inverter housing 240.

Figure 5:
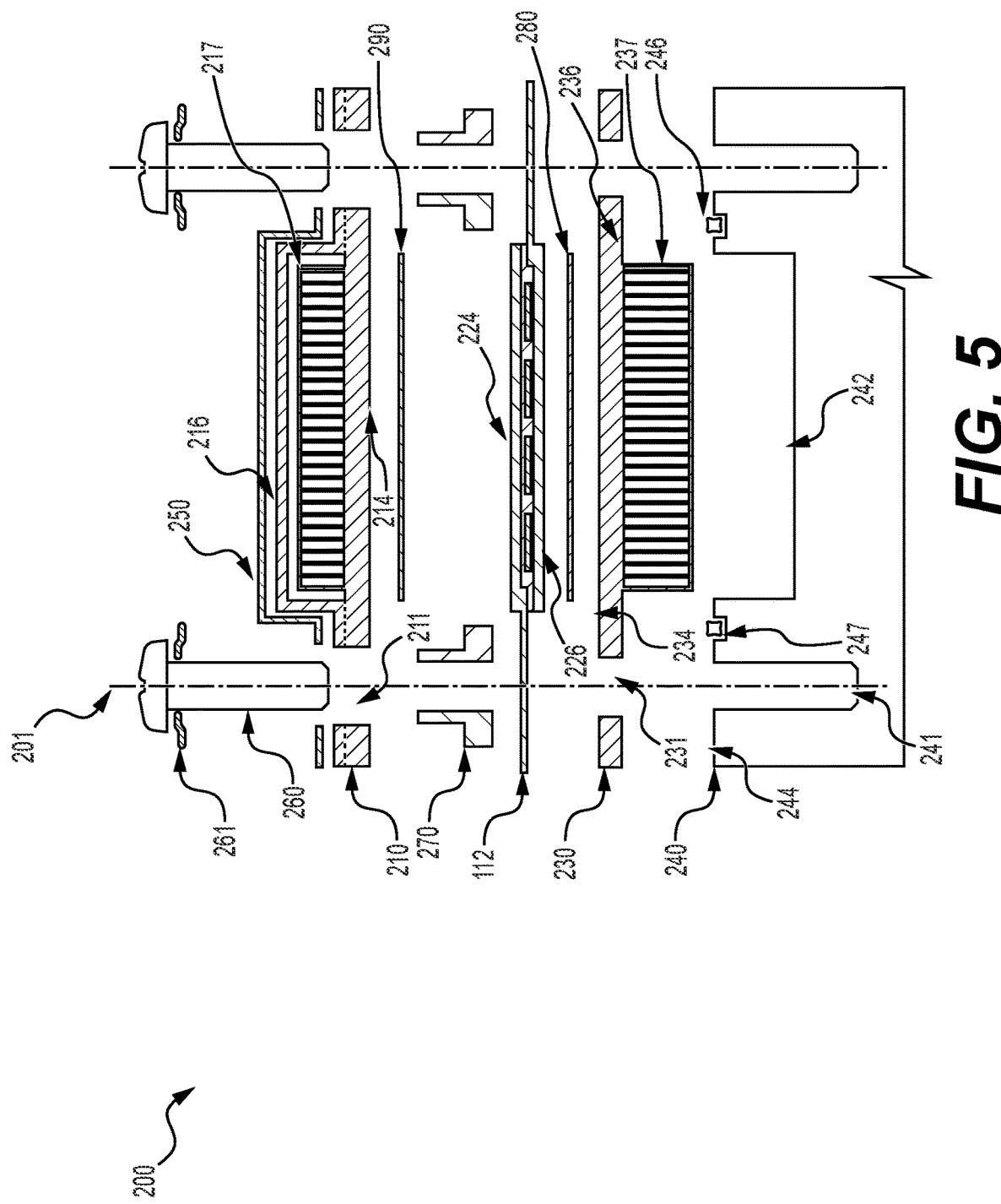
FIG. 5 depicts a cross-sectional view along line 203 of the exemplary cooling module assembly of FIG. 2, according to one or more embodiments.

FIG. 5 depicts a cross-sectional view along line 203 of the exemplary cooling module assembly of FIG. 2, according to one or more embodiments. Cooling module assembly 200 may include first heat sink 210, power module 112, second heat sink 230, and inverter housing 240.

First heat sink 210 may include first surface 214 to face second heat sink 230. First surface 214 may include a thermal interface material (TIM) layer 290 to aid in thermal conduction between first heat sink 210 and power module 112. TIM layer 290 may include any suitable thermal tapes, gels, thermal epoxies, solders, greases, gap-filled pads, phase change materials, or combination thereof. TIM layer 290 may include any suitable material, such as silicone elastomer, fiberglass, or a combination thereof, for example.

First heat sink 210 may include second surface 216 to face away from second heat sink 230. First heat sink 210 may include fins 217. Fins 217 may be provided in an extruded, plain, wavy, pin, folded, bonded, active fan, stamping, or cross-cut configuration. Fins 217 may be located between first surface 214 and second surface 216 of first heat sink 210.

Cooling module assembly 200 may include mounting bridge 250. Mounting bridge 250 may be in contact with second surface 216 of first heat sink 210. Mounting bridge 250 may have a corresponding size and shape as second surface 216 of first heat sink 210.

Cooling module assembly 200 may include mounting screw 260. Mounting screw 260 may include one or more mounting screws. Mounting screw 260 may be any suitable fastener to fasten elements of cooling module assembly 200. Mounting screw 260 may be inserted into first mounting hole 211 of first heat sink 210. Mounting screw 260 may include spring washer 261. Spring washer 261 may be in contact with mounting bridge 250.

Cooling module assembly 200 may include spacer 270. Spacer 270 may include one or more spacers, such as two spacers as shown in FIG. 5. Spacer 270 may extend through first mounting hole 211 of first heat sink 210, and spacer 270 may be in contact with mounting screw 260. Spacer 270 may provide distance and tolerance control between first heat sink 210 and second heat sink 230. Spacer 270 may provide galvanic (nickel-plated) compliance.

First surface 224 of power module 112 may be in contact with TIM layer 290. Second surface 226 of power module 112 may be in contact with a portion of second heat sink 230. Cooling module assembly 200 may include hard joint 280. Hard joint 280 may be a TIM or glue, for example. Hard joint 280 may connect power module 112 to second heat sink 230. Hard joint 280 may be in contact with a portion of second surface 226 of power module 112.

Second heat sink 230 may include a first surface 234. A portion of first surface 234 of second heat sink may be in contact with hard joint 280. Second heat sink 230 may include a second surface 236. Second surface 236 on second heat sink may include fins 237. Fins 237 may be provided in an extruded, plain, wavy, pin, folded, bonded, active fan, stamping, or cross-cut configuration. Second heat sink 230 may include second mounting hole 231. Second mounting hole 231 may be circular or any polygon shape. Second mounting hole 231 of second heat sink 230 may be aligned along axis 201 with first mounting hole 211 of first heat sink 210. Mounting screw 260 may be inserted into second mounting hole 231 of second heat sink 230.

Inverter housing 240 may include a first surface 244. First surface 244 may include third mounting hole 241. Third mounting hole 241 may include one or more mounting holes. First surface 244 may include cavity 242. Cavity 242 may have a size and shape to receive fins 237 of second heat sink 230.

Third mounting hole 241 of inverter housing 240 may be aligned along axis 201 with second mounting hole 231 of second heat sink 230. Third mounting hole 241 of inverter housing 240 may be aligned with first mounting hole 211 of first heat sink 210. Mounting screw 260 may be inserted into third mounting hole 241 of inverter housing 240.

Cavity 242 may receive fins 237 of second heat sink 230. First surface 244 of inverter housing 240 may be in contact with second surface 236 of second heat sink 230. First surface 244 may include groove 247. Groove 247 may include x-ring seal 246. X-ring seal 246 may be in contact with second surface 236 of second heat sink 230.

Figure 6:
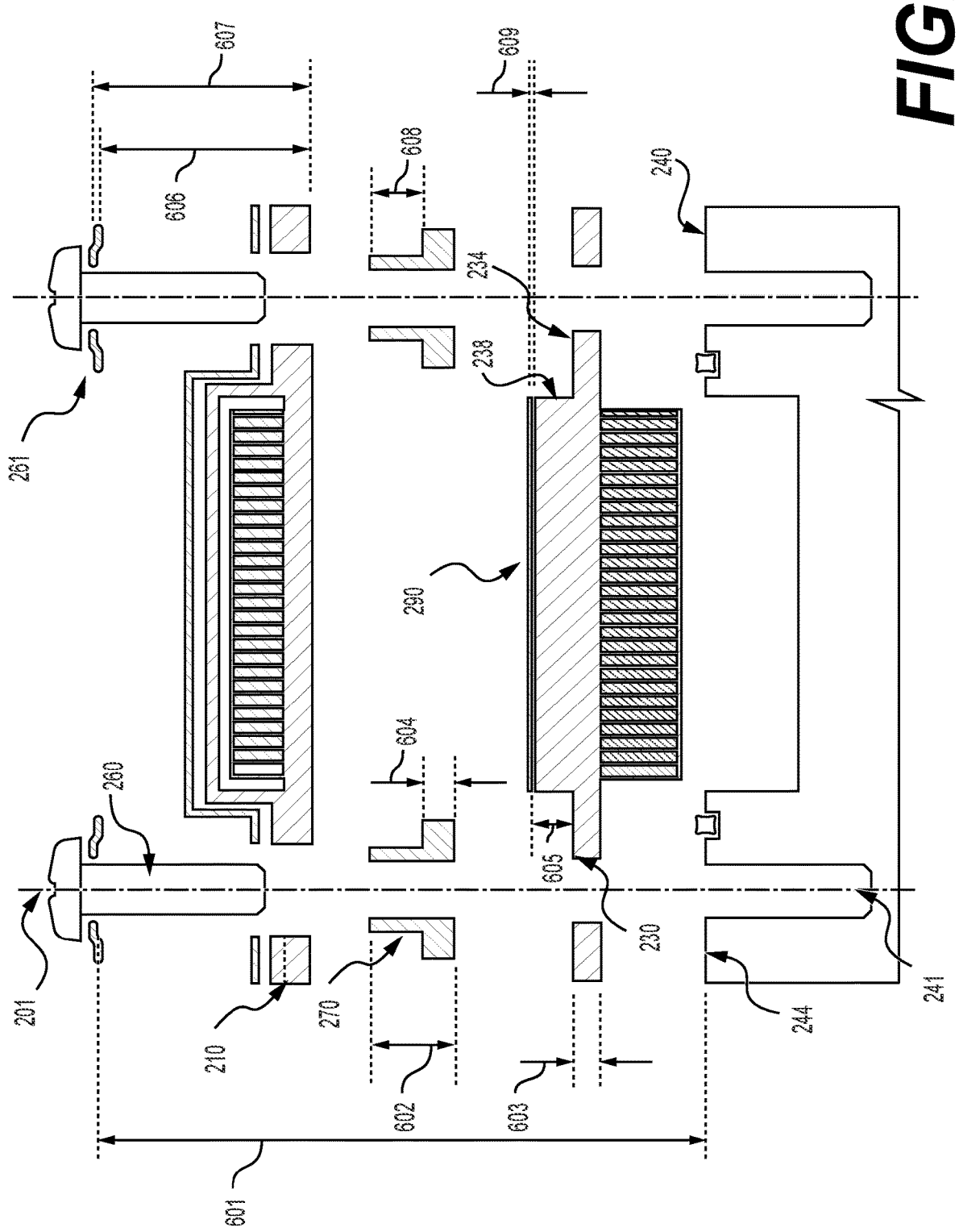
FIG. 6 depicts a cross-sectional view along line 204 of the exemplary cooling module assembly of FIG. 2, according to one or more embodiments.

FIG. 6 depicts a cross-sectional view along line 204 of the exemplary cooling module assembly of FIG. 2, according to one or more embodiments. As shown in FIG. 6, cooling module assembly 200 includes first heat sink 210, second heat sink 230, and inverter housing 240. Power module 112 (see FIG. 2) is not visible in the cross-sectional view along line 204. First surface 234 of second heat sink 230 may include first integrated spacer 238. First integrated spacer 238 may be included on a portion of first surface 234 of second heat sink 230. First integrated spacer 238 may include a thermal interface material (TIM) layer 290 to aid in thermal conduction between second heat sink 230 and power module 112. TIM layer 290 may include any suitable thermal tapes, gels, thermal epoxies, solders, greases, gap-filled pads, phase change materials, or combination thereof. TIM layer 290 may include any suitable material silicone elastomer, fiberglass, or combination thereof. TIM layer 290 may be in contact with a portion of first integrated spacer 238.

Distance 601 along axis 201 may be defined between spring washer 261 of mounting screw 260 and first surface 244 of inverter housing 240 when cooling module assembly 200 is assembled. Distance 601 may be from approximately 6 mm to approximately 15 mm, for example. A solid mounting of second heat sink 230 may be achieved by reducing distance 601 between the spring washer 261 of mounting screw 260 and first surface 244 of inverter housing 240. Reducing distance 601 may increase stiffness for structure and tightness for the face seal.

Distance 602 maybe defined along axis 201 as a thickness of spacer 270 along axis 201 (provided along an axial direction of spacer 270). Distance 602 may be from approximately 4 mm to approximately 10 mm, for example. Distance 603 may be defined as a thickness of second heat sink 230 along axis 201. Distance 603 may be from approximately 2 mm to approximately 5 mm, for example. The combination of distance 602 and distance 603 may control a protrusion of mounting screw 260.

Distance 604 may be defined as a thickness of a wider portion, or flange, of spacer 270 along axis 201. Distance 604 may be from approximately 2 mm to approximately 5 mm, for example. Distance 605 may be defined as a thickness of first integrated spacer 238 along axis 201. Distance 605 may be from approximately 2 mm to approximately 5 mm, for example. Spacer 270 may cooperate with first integrated spacer 238 so that distance 604 and distance 605 may control, or set, a tolerance or space (distance) between first heat sink 210 and second heat sink 230.

Distance 606 may be defined as the distance between spring washer 261 and first surface 214 of first heat sink 210 along axis 201 when cooling module assembly 200 is assembled. Distance 606 may be from approximately 2 mm to approximately 5 mm, for example. Distance 607 may be defined as the distance between the outer ring of spring washer 261 and first surface 214 along axis 201 when cooling module assembly 200 is assembled. Distance 607 may be from approximately 2 mm to approximately 5 mm, for example. The difference between distance 606 and distance 607 may include a hallow or float mounting of the first heat sink 210 by having a spring loaded interconnection between the outer ring of the spring washer 261 and spacer 270.

Distance 608 may be defined as a thickness of a narrower portion, or protrusion, of spacer 270 along axis 201. Distance 608 may be from approximately 2 mm to approximately 5 mm, for example. Distance 608 may control the pre-load and the thickness 609 of TIM layer 290. Thickness 609 may be from approximately 50 μm to approximately 500 μm, for example. The width of the narrower portion of spacer 270 may maintain thermal and galvanic interconnection properties.

Figure 7:
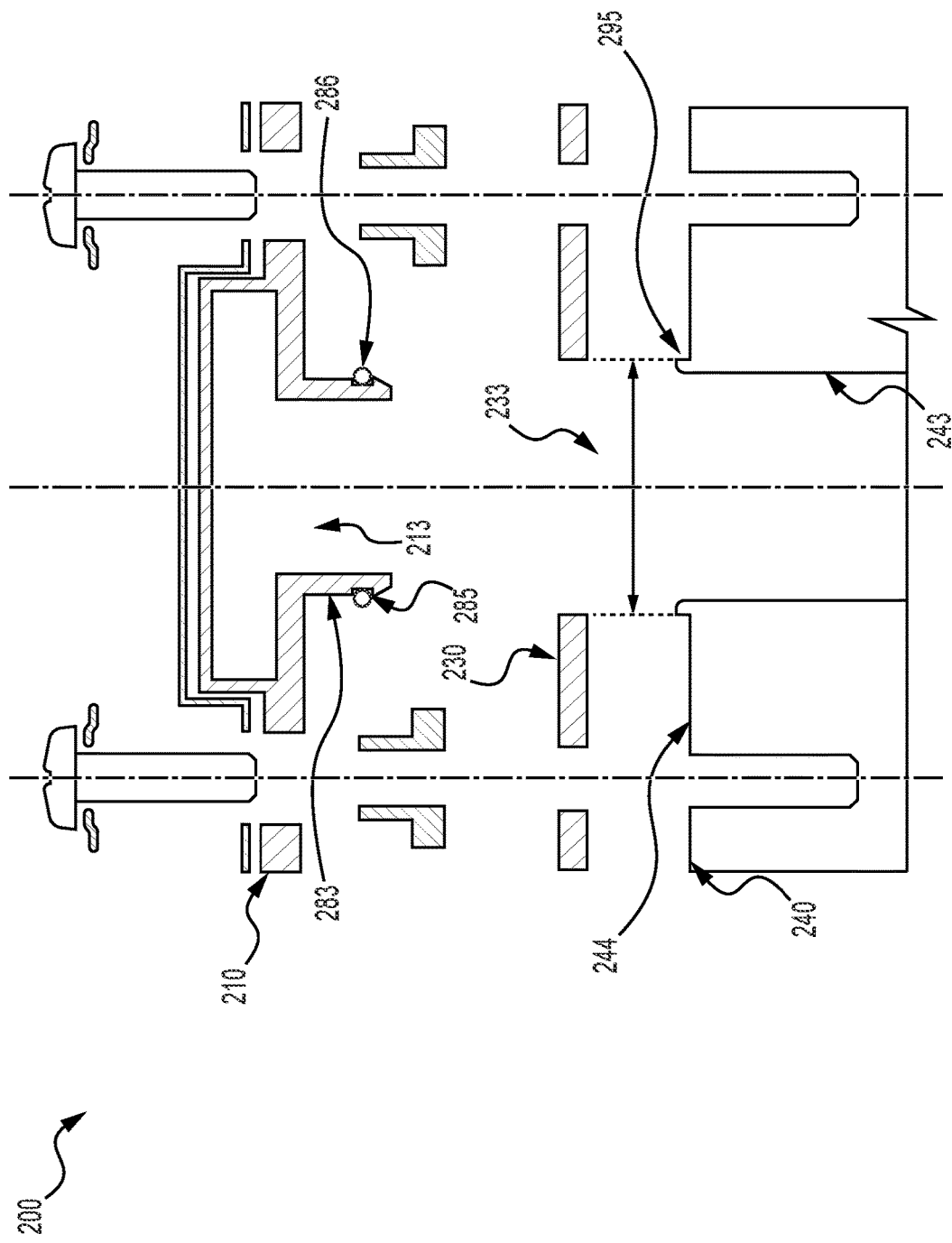
FIG. 7 depicts a cross-sectional view along line 205 of the exemplary cooling module assembly of FIG. 2, according to one or more embodiments.

FIG. 7 depicts a cross-sectional view along line 205 of an exemplary cooling module assembly 200 of FIG. 2, according to one or more embodiments. As shown in FIG. 7, cooling module assembly 200 includes first heat sink 210, second heat sink 230, and inverter housing 240. Power module 112 (see FIG. 2) is not visible in the cross-sectional view along line 204.

First heat sink 210 may include cooling pipe 283. Cooling pipe 283 may extend from first surface 214 of first heat sink 210. Cooling pipe 283 may include a groove 285. Groove 285 of cooling pipe 283 may include an O-ring seal 286. O-ring seal 286 may be in contact with inverter housing 240. O-ring seal 286 may maintain clearances, dynamic seal, and anti-galvanic interconnection.

First surface 244 of inverter housing 240 may include alignment dowel 295. Alignment dowel 295 may be cast or machined. Alignment dowel 295 may control placement and tolerance of second heat sink 230 on inverter housing 240 without galvanically interconnecting first heat sink 210 and second heat sink 230.

Cooling pipe 283 may be inserted into second heat sink first port 233 when cooling module assembly 200 is assembled. Cooling pipe 283 may be inserted into inverter housing first port 243 of inverter housing 240 when cooling module assembly 200 is assembled. O-ring seal 286 may be configured to cooperate with an inner wall of inverter housing first port 243 of inverter housing 240 to seal cooling pipe 283 to inverter housing first port 243 of inverter housing 240.

Figure 8:
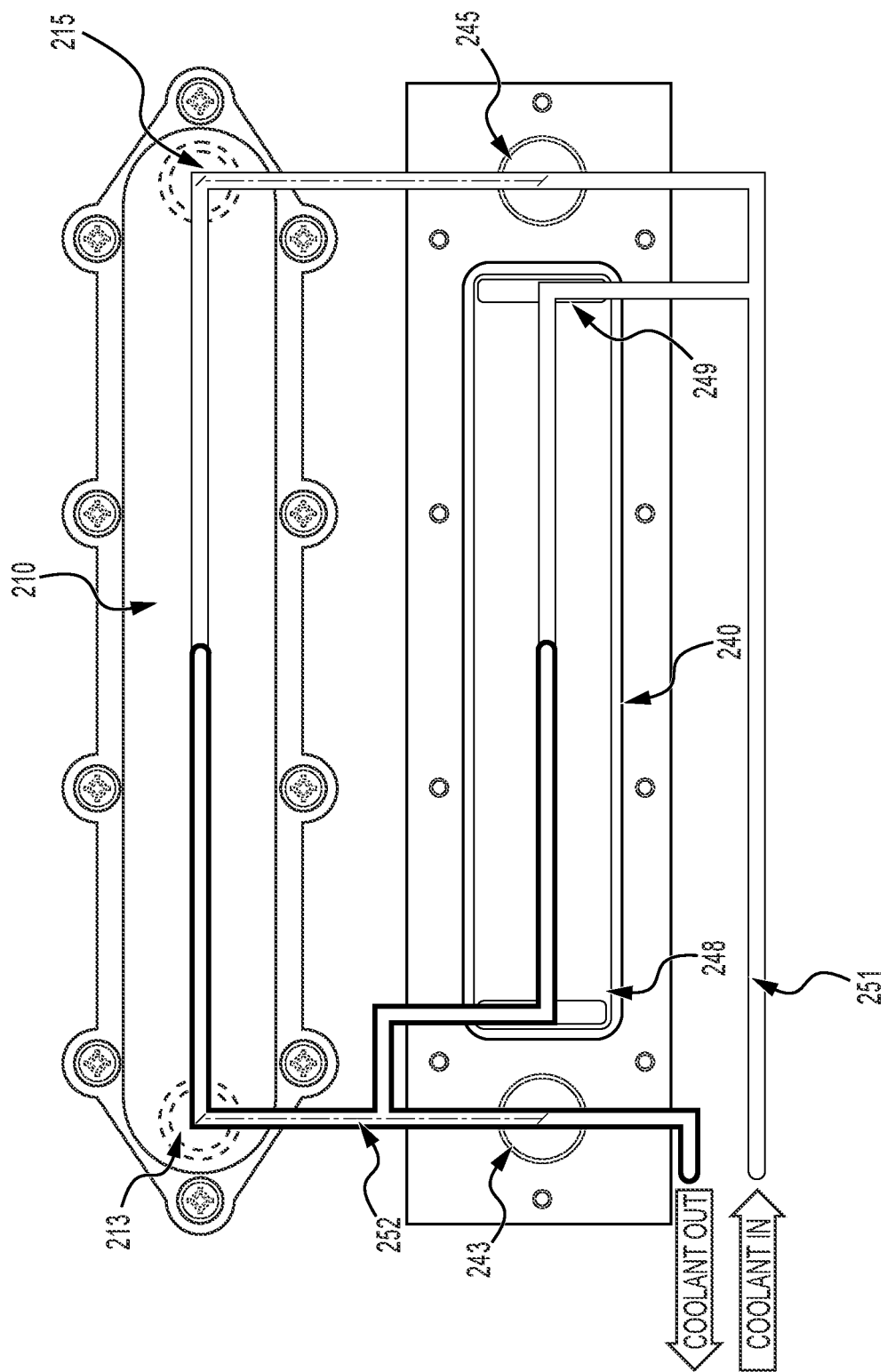
FIG. 8 depicts a parallel-flow design of the exemplary cooling module assembly of FIG. 2, according to one or more embodiments.

FIG. 8 depicts a parallel flow design of cooling module assembly 200, according to one or more embodiments. In a parallel flow design, as shown in FIG. 8, coolant 251 may enter inverter housing 240. Coolant 251 may enter cavity 242 of inverter housing 240 through second cavity port 249. Coolant 251 may flow along the longitudinal axis of cavity 242 of inverter housing 240 towards first cavity port 248. As coolant 251 flows towards first cavity port 248, heat may be exchanged from power module 112 through fins 237 to coolant 251. Coolant 251 may increase in temperature as coolant 251 flows towards first cavity port 248. Coolant 251 may be exhausted from cavity 242 through first cavity port 248 of inverter housing 240.

Coolant 251 may flow through inverter housing second port 245 of inverter housing 240 towards first heat sink second port 215. Coolant 251 may enter first heat sink 210 through first heat sink second port 215. Coolant 251 may flow along the longitudinal axis of first heat sink 210 towards first heat sink first port 213. As coolant 251 flows towards first heat sink first port 213, heat may be exchanged from power module 112 through first heat sink 210 to coolant 251. Coolant 251 may increase in temperature as coolant 251 flows towards first heat sink first port 213.

Coolant 251 may be exhausted from first heat sink first port 213. Coolant 251 exhausted from first heat sink first port 213 may be combined at an intersection point 252 with coolant 251 exhausted from first cavity port 248 of inverter housing 240. The combined exhausted coolant 251 may flow towards inverter housing first port 243. Combined exhausted coolant 251 may exit inverter housing 240.

The parallel-flow design, as depicted in FIG. 8, may be used when coolant 251 flowing across first heat sink 210 and coolant 251 flowing across inverter housing 240 are required to be brought to nearly the same outlet temperature in a short period to reduce large thermal stresses on the power device.

Figure 9:
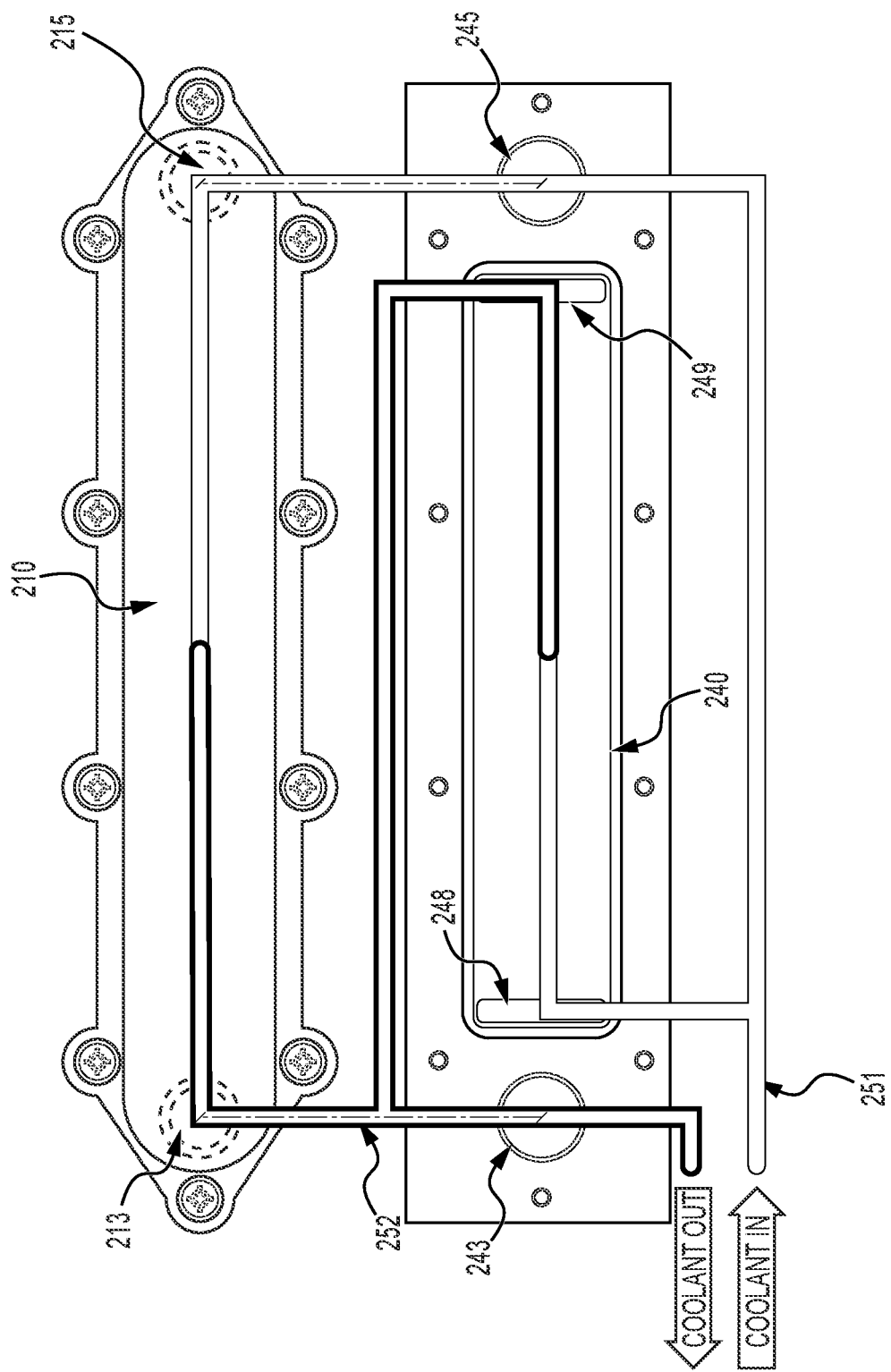
FIG. 9 depicts a counter-flow design of the exemplary cooling module assembly of FIG. 2, according to one or more embodiments.

FIG. 9 depicts a counter flow design of cooling module assembly 200, according to one or more embodiments. In a counter flow design, as shown in FIG. 9, coolant 251 may enter inverter housing 240. Coolant 251 may enter cavity 242 of inverter housing 240 through first cavity port 248 of inverter housing 240. Coolant 251 may flow along the longitudinal axis of cavity 242 of inverter housing 240 towards second cavity port 249. As coolant 251 flows towards second cavity port 249, heat may be exchanged from power module 112 through fins 237 to coolant 251. Coolant 251 may increase in temperature as coolant 251 flows towards second cavity port 249. Coolant 251 may be exhausted from cavity 242 through second cavity port 249 of inverter housing 240.

Coolant 251 may flow through inverter housing second port 245 of inverter housing 240 towards first heat sink second port 215. Coolant 251 may enter first heat sink 210 through first heat sink second port 215. Coolant 251 may flow along the longitudinal axis of first heat sink 210 towards first heat sink first port 213. As coolant 251 flows towards first heat sink first port 213, heat may be exchanged from power module 112 through first heat sink 210 to coolant 251. Coolant 251 may increase in temperature as coolant 251 flows towards first heat sink first port 213.

Coolant 251 may be exhausted from first heat sink first port 213. Coolant 251 exhausted from first heat sink first port 213 may be combined at an intersection point 252 with coolant 251 exhausted from second cavity port 249. The combined exhausted coolant 251 may flow towards inverter housing first port 243 of inverter housing 240. Combined exhausted coolant 251 may exit inverter housing 240. The counter flow design, as shown in FIG. 9, may be used when higher efficiency and lower thermal stresses are required.

Some arrangements for flow paths within power module sub-assemblies are serial and parallel flow due to the arrangement and/or requirement of a single (1+1) inlet and outlet port on the inverter housing. One or more embodiments may include integrating a bottom heat sink within the inverter housing to split the ports into 2+2 inlet and outlet coolant paths for the heat sinks, while retaining a 1+1 inverter housing coolant path.

One or more embodiments may include an inverter housing which may carry flow and coolant distribution features combined with heat sinks. One or more embodiment may reduce the complexity of manufacturing assembly used by some double-sided cooled power modules. One or more embodiments may provide low-cost manufacturing methods or assembly for an inverter. One or more embodiments may include tight tolerance control which may achieve non-galvanic interconnection among dismal material. One or more embodiments may include integrated spacers with a counter flow arrangement which may improve the thermal management of a power module by transferring heat between a top and bottom heatsink. One or more embodiments may include integrated spacers which may provide improved control of assembly tolerance for a bottom heat sink, power module, and top heat sink.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system for an electric vehicle, the system comprising:
a first heat sink including a first mounting hole extending through the first heat sink;
a second heat sink positioned adjacent to the first heat sink in an axial direction; and
a spacer between the first heat sink and the second heat sink to set a distance between the first heat sink and the second heat sink, the spacer including:
a flange that is coupled to both the first heat sink and the second heat sink, the flange having a thickness in the axial direction, and
a protrusion extending away from the flange, the protrusion received by the first mounting hole of the first heat sink,
wherein the second heat sink includes a surface facing the first heat sink, wherein the surface includes an integrated spacer to cooperate with the flange of the spacer to control the distance between the first heat sink and the second heat sink.

2. The system of claim 1, wherein the second heat sink includes fins.

3. The system of claim 2, further comprising:
a housing of an inverter, the housing including a cavity to receive the fins.

4. The system of claim 1, further comprising:
a fastener,
wherein the second heat sink includes a second mounting hole, and
wherein the fastener passes through the first mounting hole, the spacer, and the second mounting hole to fasten the first heat sink to the second heat sink.

5. The system of claim 4, further comprising:
a spring washer for the fastener.

6. The system of claim 1, further comprising:
a power module configured to convert direct current (DC) from a battery to alternating current (AC) current,
wherein the power module is positioned between the first heat sink and the second heat sink.

7. The system of claim 1, wherein the spacer provides galvanic compliance between the first heat sink and the second heat sink.

8. An inverter comprising the system of claim 1.

9. A vehicle comprising the inverter of claim 8.

10. A cooling module assembly system for an inverter, the cooling module assembly system comprising:
a first heat sink;
a second heat sink including a surface facing the first heat sink, wherein the surface includes an integrated spacer; and
a spacer between the first heat sink and the second heat sink to cooperate with the integrated spacer to control a distance between the first heat sink and the second heat sink, wherein, along an axial direction of the spacer, the spacer includes a wider portion and a narrower portion.

11. The cooling module assembly system of claim 10, further comprising:
a fastener,
wherein the first heat sink includes a first mounting hole,
wherein the second heat sink includes a second mounting hole, and
wherein the fastener passes through the first mounting hole, the spacer, and the second mounting hole to fasten the first heat sink to the second heat sink.

12. The cooling module assembly system of claim 10, wherein the second heat sink includes fins.

13. The cooling module assembly system of claim 12, further comprising:
a housing of the inverter, the housing including a cavity to receive the fins.

14. The cooling module assembly system of claim 10, wherein a thickness of the integrated spacer is equal to a thickness of a power module of the inverter and a thickness of thermal interface material to connect the power module to the cooling module assembly system between the first heat sink and the second heat sink.

15. The cooling module assembly system of claim 10, wherein the integrated spacer includes a gap to accommodate a power module of the inverter.

16. A system comprising:
an inverter configured to convert DC power from a battery to AC power to drive a motor, wherein the inverter includes:
a power module; and
a cooling system configured to cool the power module, wherein the cooling system includes:
a first heat sink including a first mounting hole extending through the first heat sink;
a second heat sink including an integrated spacer, the integrated spacer positioned adjacent to the first heat sink in an axial direction; and
a spacer between the first heat sink and the second heat sink, the spacer including:
a flange that is coupled to both the first heat sink and the second heat sink, the flange having a thickness in the axial direction, and
a protrusion extending away from the flange, the protrusion received by the first mounting hole of the first heat sink,
wherein a distance between the first heat sink and the second heat sink is set by a thickness of the integrated spacer and a thickness of the flange of the spacer.

17. The system of claim 16, wherein the thickness of the spacer is equal to a thickness of the power module and a thickness of thermal interface material to connect the power module to the cooling system between the first heat sink and the second heat sink.

18. The system of claim 16, wherein the second heat sink includes fins, and wherein the inverter includes a housing including a cavity to receive the fins.

19. The system of claim 1, further comprising:
a power module configured to be coupled to both the integrated spacer and the spacer.

20. The cooling module assembly system of claim 10, further comprising:
a first surface of a power module configured to be coupled with the second heat sink; and
a second surface of a power module configured to be coupled with the spacer.

* * * * *